(12) United States Patent
Chang

(10) Patent No.: US 10,928,870 B2
(45) Date of Patent: Feb. 23, 2021

(54) APPARATUS AND METHODS FOR TEMPERATURE-BASED MEMORY MANAGEMENT

(71) Applicant: Marvell World Trade Ltd., St. Michael (BB)

(72) Inventor: Runzi Chang, Saratoga, CA (US)

(73) Assignee: Marvell Asia PTE, Ltd.

( * ) Notice: Subject to any disclaimer, the term of this patent is extended or adjusted under 35 U.S.C. 154(b) by 78 days.

(21) Appl. No.: 16/257,860

(22) Filed: Jan. 25, 2019

(65) Prior Publication Data

US 2019/0369685 A1 Dec. 5, 2019

Related U.S. Application Data

(60) Provisional application No. 62/677,465, filed on May 29, 2018.

(51) Int. Cl.
| | | |
|---|---|---|
| G06F 1/20 | (2006.01) |
| G11C 7/04 | (2006.01) |
| G11C 16/34 | (2006.01) |
| G06F 1/3225 | (2019.01) |
| G06F 1/324 | (2019.01) |
| G06F 1/3206 | (2019.01) |
| G06F 9/50 | (2006.01) |
| G06F 1/3234 | (2019.01) |

(Continued)

(52) U.S. Cl.
CPC ............. *G06F 1/206* (2013.01); *G06F 1/324* (2013.01); *G06F 1/3225* (2013.01); *G11C 7/04* (2013.01); *G11C 16/3495* (2013.01); *G06F 1/08* (2013.01); *G06F 1/3206* (2013.01); *G06F 1/3275* (2013.01); *G06F 1/3296* (2013.01); *G06F 9/5094* (2013.01)

(58) Field of Classification Search
CPC ...... G06F 1/324; G06F 1/3206; G06F 1/3296; G06F 1/3275; G06F 1/206; G06F 1/3225; G06F 9/5094; G06F 1/08; G06F 9/30083; G11C 7/04; G11C 16/3495
USPC ........................................................ 713/322
See application file for complete search history.

(56) References Cited

U.S. PATENT DOCUMENTS 9,640,242 B1 * 5/2017 Lo ..................... G11C 11/40618
9,799,387 B1 * 10/2017 Toh .......................... G11C 7/04
(Continued)

*Primary Examiner* — Ji H Bae

(57) ABSTRACT

The present disclosure describes apparatuses and methods for temperature-based memory management. In some aspects, a temperature-based memory manager receives, from a temperature sensor of a memory block, an indication of a temperature of the memory block. The temperature-based memory manager compares the indication of the temperature with a temperature threshold associated with the memory block. Based on a result of the comparison, the temperature-based memory manager alters a frequency of a clock signal by which the memory block operates effective to change power consumption of the memory block. By so doing, power consumption of the memory block may be reduced, and operating temperatures of the memory block can be kept below temperatures that are likely to affect reliability of storage cells of the memory block. This can be effective to improve reliability and long-term performance of the memory block, particularly in high-performance or mission critical applications.

20 Claims, 9 Drawing Sheets

(51) Int. Cl.
*G06F 1/08* (2006.01)
*G06F 1/3296* (2019.01)

(56) References Cited

U.S. PATENT DOCUMENTS

| | | | | |
|---|---|---|---|---|
| 2005/0228612 A1* | 10/2005 | Oh | G06F 1/206 | 702/132 |
| 2006/0187731 A1* | 8/2006 | Sako | G11C 11/40626 | 365/222 |
| 2010/0091562 A1* | 4/2010 | Chen | G11C 11/1659 | 365/171 |
| 2010/0138684 A1* | 6/2010 | Kim | G06F 1/3225 | 713/601 |
| 2011/0235459 A1* | 9/2011 | Ware | G11C 7/1093 | 365/233.11 |
| 2013/0227268 A1* | 8/2013 | Ichida | G06F 9/448 | 713/100 |
| 2014/0369110 A1* | 12/2014 | Cho | G11C 7/04 | 365/149 |
| 2015/0279472 A1* | 10/2015 | Jones | G11C 16/24 | 365/185.19 |
| 2016/0125921 A1* | 5/2016 | Kambegawa | G06F 12/06 | 711/106 |
| 2018/0284857 A1* | 10/2018 | Yang | G11C 5/04 | |

\* cited by examiner

APPARATUS AND METHODS FOR TEMPERATURE-BASED MEMORY MANAGEMENT

CROSS REFERENCE TO RELATED APPLICATIONS

This present disclosure claims priority to U.S. Provisional Patent Application Ser. No. 62/677,465 filed May 29, 2018, the disclosure of which is incorporated by reference herein in its entirety.

BACKGROUND

To accommodate the ever-increasing expectations of users for higher computing performance, many memory manufacturers implement advanced chips that feature high-density, high-performance memories. These high-density memory chips, which are often created using sub-65 nm process technology nodes, can experience reliability issues through use over extended periods of time. For example, some users may start to encounter memory block read/write errors or failures after years of using their devices to access the memory blocks. This presents a risk for chip manufactures because the memory block issues are not readily apparent at the time manufacture yet may develop over time and across a large numbers of memory chips already deployed to the field. In some cases, the memory block errors can lead to system failure when enough block errors accumulate to cause a condition from which the system is unable to recover.

Due to these reliability issues, some memory chip designers have made efforts to improve dependability though redundancy, in either hardware or software. For example, memory chips may include redundant circuitry, such as extra circuitry for a few rows and columns of a memory block, error-correcting codes (ECC) that include additional bits to improve data integrity, and so on. These temporary solutions, however, fail to address a root cause of the reliability issues and involve tradeoffs of additional silicon area, increased data access, or reduced data throughput. As such, most memory chips are negatively affected by the design and performance tradeoffs associated with the redundant fixes, while still being susceptible to long term reliability issues related to the memory block errors or failure.

SUMMARY

This summary is provided to introduce subject matter that is further described in the Detailed Description and Drawings. Accordingly, this Summary should not be considered to describe essential features nor used to limit the scope of the claimed subject matter.

In some aspects, a temperature-based memory manager implements a method that receives, from a temperature sensor of a memory block, an indication of a temperature of the memory block. The temperature-based memory manager compares the indication of the temperature with a temperature threshold associated with the memory block. Based on a result of the comparison, the temperature-based memory manager alters a frequency of a clock signal by which the memory block operates effective to change power consumption of the memory block. By so doing, power consumption of the memory block may be reduced, and operating temperatures of the memory block can be kept below temperatures that are likely to affect reliability of storage cells of the memory block. This can improve overall reliability and long-term performance of the memory block, particularly in high-performance or mission critical applications.

In other aspects, an apparatus comprises a memory configured with memory blocks of storage cells and at least one temperature sensor operably coupled with one of the memory blocks, the temperature sensor disposed between storage cells of the memory block. The apparatus also includes a clock circuit configured to provide a clock signal to the memory block to enable operation of the memory block and a temperature-based memory manager. The temperature-based memory manager is configured to receive, from the temperature sensor of the memory block, an indication of a temperature of the memory block. The indication of the temperature of the memory block is compared with a temperature threshold associated with the memory block. Based on a result of the comparison, the temperature-based memory manager alters a frequency of the clock signal provided by the clock circuit effective to change power consumption of the memory block.

In yet other aspects, a System-on-Chip (SoC) is described that includes an interface to a block of memory storage cells, an interface to temperature sensors operably coupled with the block of memory storage cells, a hardware-based processor, and a memory storing processor-executable instructions that, responsive to execution by the hardware-based processor, implement a temperature-based memory manager. The temperature-based memory manager is implemented to receive, from the temperature sensors, respective indications of temperatures of the storage cells of the block of memory. The temperature-based memory manager compares the respective indications of temperature of the storage cells with a temperature threshold associated with the block of memory. Based on a result of the comparison, the temperature-based memory manager alters a frequency of a clock signal by which the storage cells of the block of memory operate effective to change power consumption of the memory block.

The details of one or more implementations are set forth in the accompanying drawings and the following description. Other features and advantages will be apparent from the description and drawings, and from the claims.

BRIEF DESCRIPTION OF THE DRAWINGS

The details of one or more implementations of temperature-based memory management are set forth in the accompanying figures and the detailed description below. In the figures, the left-most digit of a reference number identifies the figure in which the reference number first appears. The use of the same reference numbers in different instances in the description and the figures indicates like elements.

DETAILED DESCRIPTION

Figure 1:
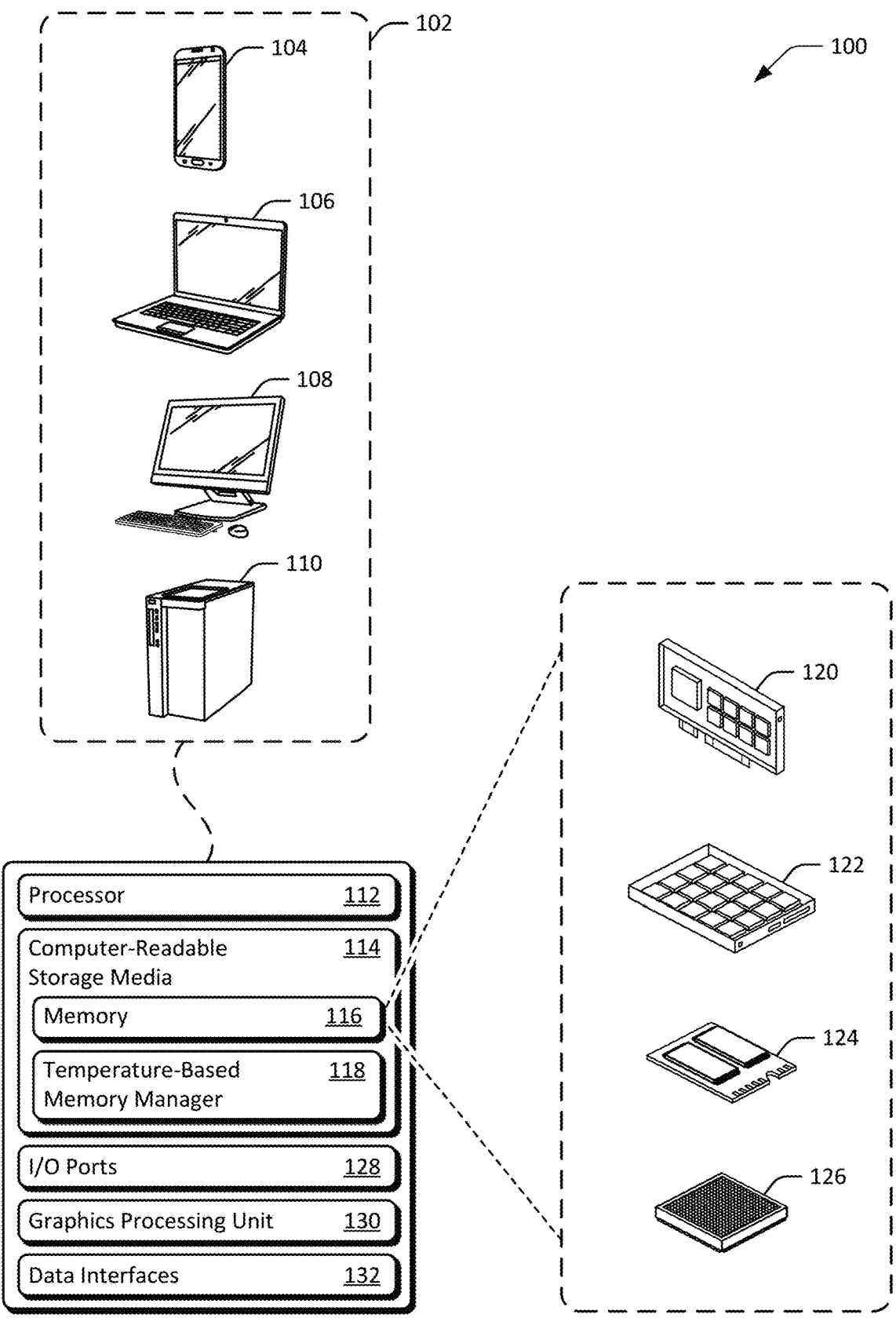
FIG. 1 illustrates an example operating environment having devices in which memory is implemented in accordance with one or more aspects.

Conventional techniques for addressing memory reliability issues often rely on the addition of redundant circuitry or information to memory blocks in order to mask or mitigate the reliability issues from a user's standpoint. For example, memory chips may include redundant circuitry, such as extra row and column circuitry for memory blocks, Error-Correcting Code (ECC) with additional bits to improve data integrity, and the like. These redundancy-based solutions, however, are only a temporary measure because it is unfeasible to provide redundancy for every memory bit and some may even accelerate wear on the memory chip. Additionally, these solutions fail to address a root cause of the reliability issue, and therefore offer little insight into any long-term solution for improved memory reliability. As such, many conventional memory chips suffer from the design and performance impairments associated with redundancy-based solutions, while still being susceptible to the long-term reliability issues related to memory block errors or failures that occur over time.

This disclosure describes apparatuses and techniques for temperature-based memory management. In some aspects, a temperature-based memory manager manages power consumption of memory blocks by detecting temperatures of the memory blocks and altering, based on the detected temperatures, operation of the memory blocks. By so doing, the temperature-based memory manager can control the temperature of the memory blocks, such as to keep the temperature within a predefined range to improve long-term memory chip reliability. Generally, if the detected temperatures exceed a threshold or limit associated with the memory block, the temperature-based memory manager can decide to lower the frequency (e.g., clock speed) of the memory block to reduce the power. This reduction in power will in turn reduce the temperature of the memory block, keeping the temperature within a safe range. By so doing, the possibility of high temperature-induced reliability risk can be minimized, over the lifetime of the memory chip, to a negligible factor.

By way of review, power and temperature can be key issues with respect to reliability in high-density, high power memory chips as illustrated by Moore's Law and Dennard Scaling. High-speed read operations and high-speed writes operations often consume large amounts of power, which in turn generates heat that elevates a temperature of the memory blocks. In general, the dynamic power P of the memory chip can be quantified as shown in equation 1, where f is frequency, C capacitance, and V is voltage.

$$P = \frac{1}{2}fCV^2 \qquad \text{Equation 1}$$

Dynamic Memory Power

With increasingly dense and faster memory (e.g., increased frequency f), higher power consumption combined with boundary conditions of the memory chip would typically raise temperatures inside memory blocks during high-speed operations. From a transistor-device-physics point of view, higher temperature is generally a negative factor for transistor and wire reliability, especially in terms of time-dependent dielectric breakdown (TDDB), negative bias temperature instability (NBTI, for P-type MOS), positive bias temperature instability (PBTI, for N-type MOS), and electrical migration for wires. In general, the NBTI failure model for PMOS can be quantified as shown in equation 2, where $E_a$ is activation energy, k is Boltzmann's constant, T is temperature, $V_g$ is gate voltage, and m is a voltage acceleration factor.

$$\text{Time to Failure} \sim e^{\frac{E_a}{kT}} V_g^m \qquad \text{Equation 2}$$

Time to Failure (TTF)

With reference to memory block reliability, the NBTI and associated failure model are a known factor for PMOS transistor wear out. This NBTI related failure may be exhibited as transistor threshold voltage increasing and drive current decreasing, which can eventually cause a memory read failure, such as in widely used 6-Transistor static random-access memory (SRAM) chips. Thus, operating temperature is a contributing factor in memory block failure in high-performance, high-density memory chips. Accordingly, the aspects of temperature-based memory management, which enable temperature of memory block to be kept within a safe range, can minimize the possibility of high temperature-induced reliability risk over the lifetime of the memory chip.

This disclosure describes apparatuses and techniques for temperature-based memory management, which may be implemented in accordance with one or more aspects to improve memory chip, memory block, or memory storage cell reliability. In some aspects, a temperature-based memory manager receives, from a temperature sensor of a memory block, an indication of a temperature of the memory block. The temperature-based memory manager compares the indication of the temperature with a temperature threshold associated with the memory block. Based on a result of the comparison, the temperature-based memory manager alters a frequency of a clock signal (or voltage) by which the memory block operates effective to change power consumption of the memory block. By so doing, power consumption of the memory block may be reduced, and operating temperatures of the memory block can be kept below temperatures that are likely to affect reliability of storage cells of the memory block. This can be effective to improve reliability and long-term performance of the memory block, particularly in high-performance or mission critical applications.

The following discussion describes an operating environment, techniques that may be employed in the operating environment, and a System-on-Chip (SoC) in which components of the operating environment can be embodied. In the context of the present disclosure, reference is made to the operating environment by way of example only.

Operating Environment

FIG. 1 illustrates an example operating environment 100 having a computing device 102, which is capable of storing or accessing various forms of data or information. Examples of a computing device 102 include a smart phone 104, laptop computer 106, desktop computer 108, and server 110. Further examples of computing device 102 (not shown) include a tablet computer, a set-top-box, a data storage appliance, wearable smart-device, television, content-streaming device, high-definition multimedia interface (HDMI) media stick, wearable-computers, smart appliance, home automation controller, smart thermostat, Internet-of-Things (IoT) device, mobile-internet device (MID), a network-attached-storage (NAS) drive, gaming console, automotive entertainment device, automotive computing system, automotive control module (e.g., engine or power train control module), and so on. Generally, the computing device 102 may store or communicate data for any suitable purpose, such as to enable functionalities of a particular type of device, provide a user interface, enable network access, implement gaming applications, playback media, provide navigation, edit content, or the like.

The computing device 102 includes a processor 112 and computer-readable storage media 114. The processor 112 can be implemented as any suitable type or number of processors, either single-core or multi-core, for executing instructions or commands of an operating system or other programs of the computing device 102. The computer-readable media 114 (CRM 114) includes memory 116 and a temperature-based memory manager 118. The memory 116 can include any suitable type or combination of volatile memory or nonvolatile memory. For example, the volatile memory of computing device 102 may include various types of random-access memory (RAM), dynamic RAM (DRAM), static RAM (SRAM) or the like. The non-volatile memory may include read-only memory (ROM), electronically erasable programmable ROM (EEPROM) or Flash memory (e.g., NOR Flash or NAND Flash). These memories, individually or in combination, may store data associated with applications and/or an operating system of computing device 102. In some aspects, the temperature-based memory manager 118 manages access of the memory 116, such as by altering parameters or settings associated with operation the memory 116 which may include frequency or voltage levels. How the temperature-based memory manager 118 is implemented and used varies and is described herein.

In the example environment 100, the memory 116 of the computing device 102 is illustrated as a variety of memory devices (e.g., memory components, modules, or peripherals). These memory devices include a peripheral component interconnect express (PCIe) solid-state drive 120, a solid-state drive 122 (SSD 122, e.g., SATA SSD), an embedded memory module 124, and a memory chip 126. As described with reference to memory 116, these memory devices may be implemented with any suitable type or a combination of memory technology. For example, the SSD 122 may be implemented with a combination of non-volatile memory for storing data and volatile memory to implemented data buffers or caches. Alternately or additionally, a memory device or memory component can store data associated with an operating system or applications of the computing device 102. In such cases, the operating system (OS) or applications of the computing device 102 may issue access requests to write or read data from one or more components of the memory 118 to implement operations of computing device 102.

The computing device 102 may also include I/O ports 128, a graphics processing unit 130 (GPU 130), and data interfaces 132. Generally, the I/O ports 128 allow a computing device 102 to interact with other devices, peripherals, or users. For example, the I/O ports 128 may include or be coupled with a universal serial bus, human interface devices, audio inputs, audio outputs, or the like. The GPU 130 processes and renders graphics-related data for computing device 102, such as user interface elements of an operating system, applications, or the like. In some cases, the GPU 130 accesses a potion of the memory 116 to render graphics or includes dedicated memory for rendering graphics (e.g., video RAM) of the computing device 102. In the cases of dedicated memory, the GPU 130 may include an instance of the temperature-based memory manager 118 to manage the dedicated graphics memory in accordance of one or more aspects described herein.

The data interfaces 132 of the computing device 102 provide connectivity to one or more networks and other devices connected to those networks. The data interfaces 132 may include wired interfaces, such as Ethernet or fiber optic interfaces for communicated over a local network, intranet, or the Internet. Alternately or additionally, the data interfaces 132 may include wireless interfaces that facilitate communication over wireless networks, such as wireless LANs, wide-area wireless networks (e.g., cellular networks), and/or wireless personal-area-networks (WPANs). Any of the data communicated via the data interfaces 132 can be written to or read from the memory 116 of the computing device 102 in accordance with one or more aspects of temperature-based memory access.

Figure 2:
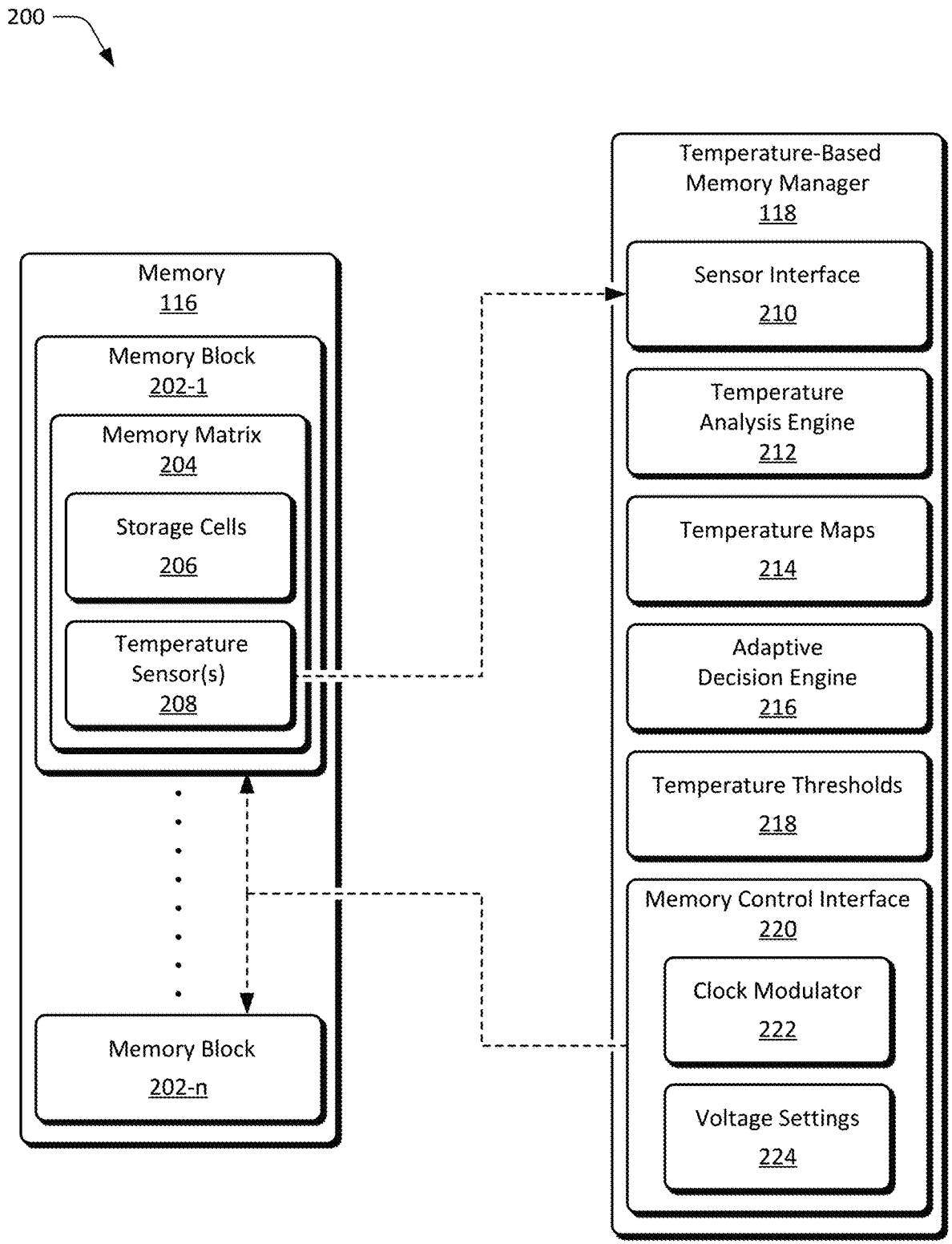
FIG. 2 illustrates example configurations of memory and a temperature-based memory manager shown in FIG. 1.

FIG. 2 illustrates example configurations of memory 116 and a temperature-based memory manager 118 generally at 200, which are implemented in accordance with one or more aspects of temperature-based memory management. In this example, the memory 116 includes multiple memory blocks 202-1 through 202-n, where n can be any suitable integer. Generally, a memory block 202-1 has a memory matrix 204 that includes circuitry for accessing storage cells 206 of the memory block 202-1. In aspects of temperature-based memory management, the memory matrix 204 also includes one or more temperature sensors 208, which may be disposed among, between, or proximate the storage cells 206 of the memory block 202-1. In some aspects, the temperature sensors 208 enable the temperature-based memory manager 118 to measure and report the temperatures in gradients of or within the memory block 202-1 in real time. How the memory matrix 204 and storage cells 206 are implemented and used varies and is described herein.

In this example, the temperature-based memory manager 118 includes a sensor interface 210, temperature analysis engine 212, and temperature maps 214. The sensor interface 210 may monitor or detect temperature information provided by the temperature sensors 208 that are integrated or operably coupled with the memory block 202-1. The temperature sensors 208 may provide an indication of temperature for the memory block 202-1 in any suitable format, such as a digital value (e.g., absolute, relative, or offset), an analog voltage signal, an analog current signal, or the like. In some implementations, the sensor interface 210 may infer temperature information of or within a memory block based on a number of access requests to write or read data from one or more components of a memory. In such an implementation, temperature sensors are not utilized, and temperature information can be determined (or inferred) based on a database that contains a correlation of (i) various temperatures to (ii) the number of access requests. Based on an inferred temperature, a temperature map may be generated as discussed in greater detail below.

Generally, the sensor interface 210 enables the temperature-based memory manager 118 to monitor or collect temperature data for analysis and/or generation of the temperature maps 214. The temperature analysis engine 212 can analyze the temperature data to construct, model, or generate the temperature maps 214 for the memory block 202-1. In some cases, the temperature analysis engine 212 uses predefined algorithms or programmable algorithms to construct the temperature maps 214. Although not shown, the temperature maps 214 may model or estimate respective temperatures throughout the memory block 202-1, such as across a memory matrix 204, or for different areas or regions of storage cells 206. In other words, the temperature analysis engine 212 may use the temperature sensor 208 data (e.g., limited data) to compute a range of temperatures for the memory block 202-1 and/or a modeled maximum temperature of the memory block 202-1, which can be reliability-sensitive to high operating temperature. The analysis of the temperature data may be performed through the use of artificial intelligence, interpolation, extrapolation, response surface analysis, statistical learning, machine learning, or the like.

Based on the temperature maps 216 or data provided by the temperature sensors 208 the adaptive decision engine 216 may act to manage the memory 116 or the memory block 202-1. In some aspects, the adaptive decision engine 216 monitors the temperature maps 216 and compares values of the temperature maps 216 with temperature thresholds 218, which may be predefined or configurable thresholds. When a temperature of the memory block 202-1 reaches or exceeds one of the temperature thresholds 218, adaptive decision engine 216 can communicate with or control the memory control interface 220 to alter operational parameters of the memory block 202-1. For example, the adaptive decision engine 216 can set or adjust a clock frequency of the memory block via the clock modulator 222 or alter an operational voltage of the memory block 202-1 via voltage settings 224. In some cases, the adaptive decision engine 216 can cause the clock module (e.g., clock multiplexer module) to switch the clock speed to lower frequency for the read or write operations associated with the memory block 202-1.

Alternately or additionally, the adaptive decision engine 216 can iteratively lower frequency of memory block access, such as when one decrease in clock frequency does not sufficiently reduce temperature of the memory block 202-1. Depending the adaptive decision engine 216, an operating frequency of the memory block 202-1 may be decreased, unchanged, or even increased, such as when the temperature sensors 208 indicate temperatures are within the safe range and a system deems or indicates that higher frequency memory data rates desirable (e.g., to improve device performance). In some aspects, this tight control of memory block temperature can ensure less transistor-level device degradations and smaller variations, which in turn result in a lower defect parts per million (DPPM) for the memory blocks and provide more competitive memory chips for high reliability applications (e.g., automotive or aerospace).

Figure 3:
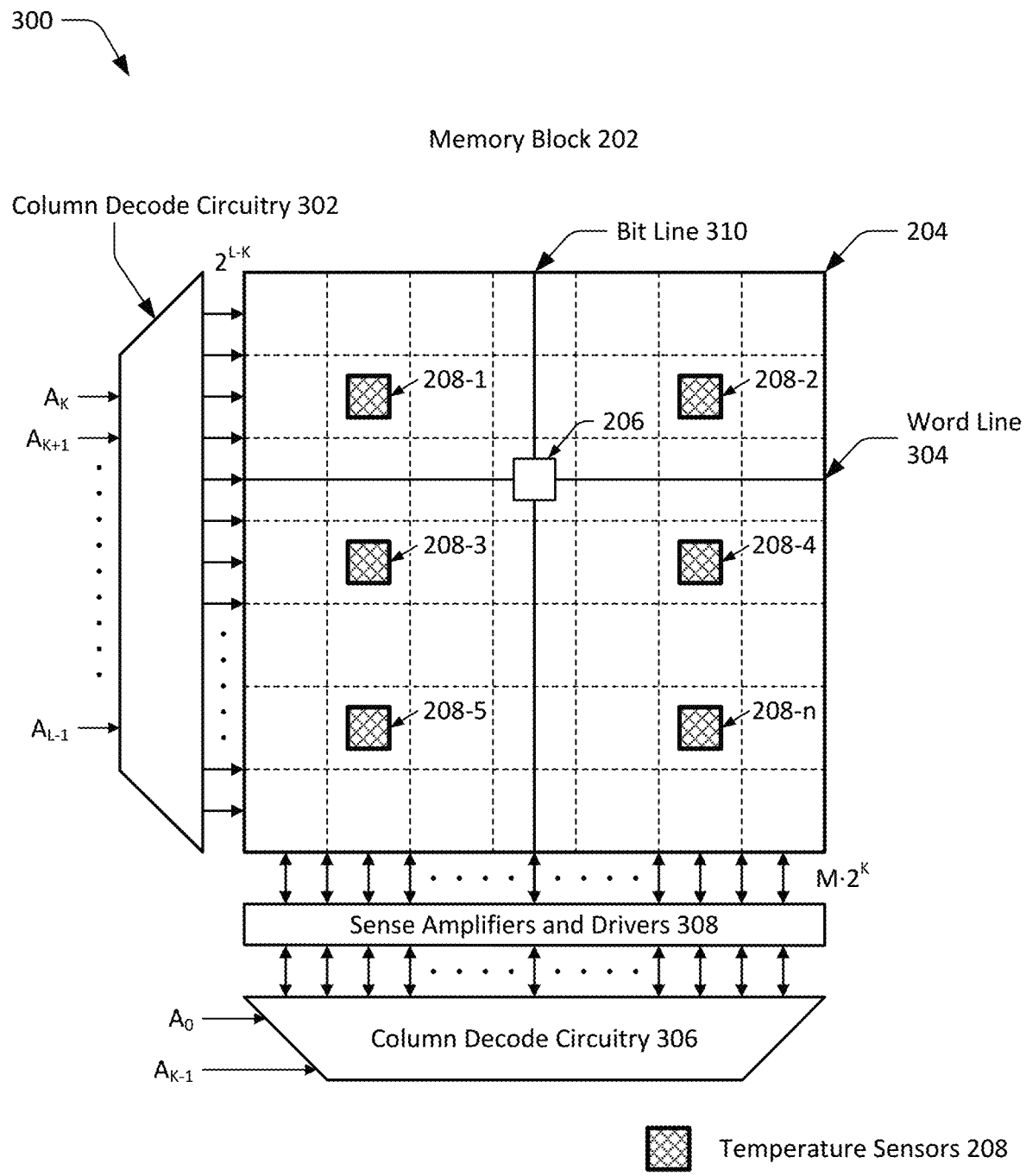
FIG. 3 illustrates an example configuration of a memory block implemented with temperature sensors in accordance with one or more aspects.

FIG. 3 illustrates an example configuration of a memory block 202 at 300 that is implemented with temperature sensors 208 in accordance with one or more aspects of temperature-based memory management. In this example, the memory matrix 204 of the memory block 202 is implemented as a $2^{L-K}$ row by M×$2^K$ column storage cell array. The memory matrix 204 includes row decode circuitry 302, which selects an appropriate word line 304 to activate based on address information. The memory matrix 204 also includes column decode circuitry 208 and sense and drive amplifiers 308, which are useful to select an appropriate bit line 310 to activate based on the address information. As shown in FIG. 3, the storage cell 206 is located and accessible via the intersection of the word line 304 and the bit line 310 that are activated to access the storage cell 206.

In aspects of temperature-based memory management, multiple temperature sensors 208-1 through 208-n are integrated near or within the memory block 202. Alternately, a memory block may be implemented with one integrated temperature sensor located among or between storage cells of the memory block. This can be effective to enable the measurement and reporting of respective temperatures in areas or gradients of the memory block 202 in real time. As such, the placement or disposition of the temperature sensors 208 within the memory block 202 provides quicker and/or more accurate temperature information than remote sensors, which can be slow due to heat soak and distance from the storage cells. In some cases, the temperature sensors 208 are designed or implemented based on existing memory chip designs or memory process technology files. By so doing, the temperature sensors 208 can be manufactured in a same process flow as the memory chip, which enables sensor integration and may save costs associated with implementing the temperature sensors 208.

Figure 4:
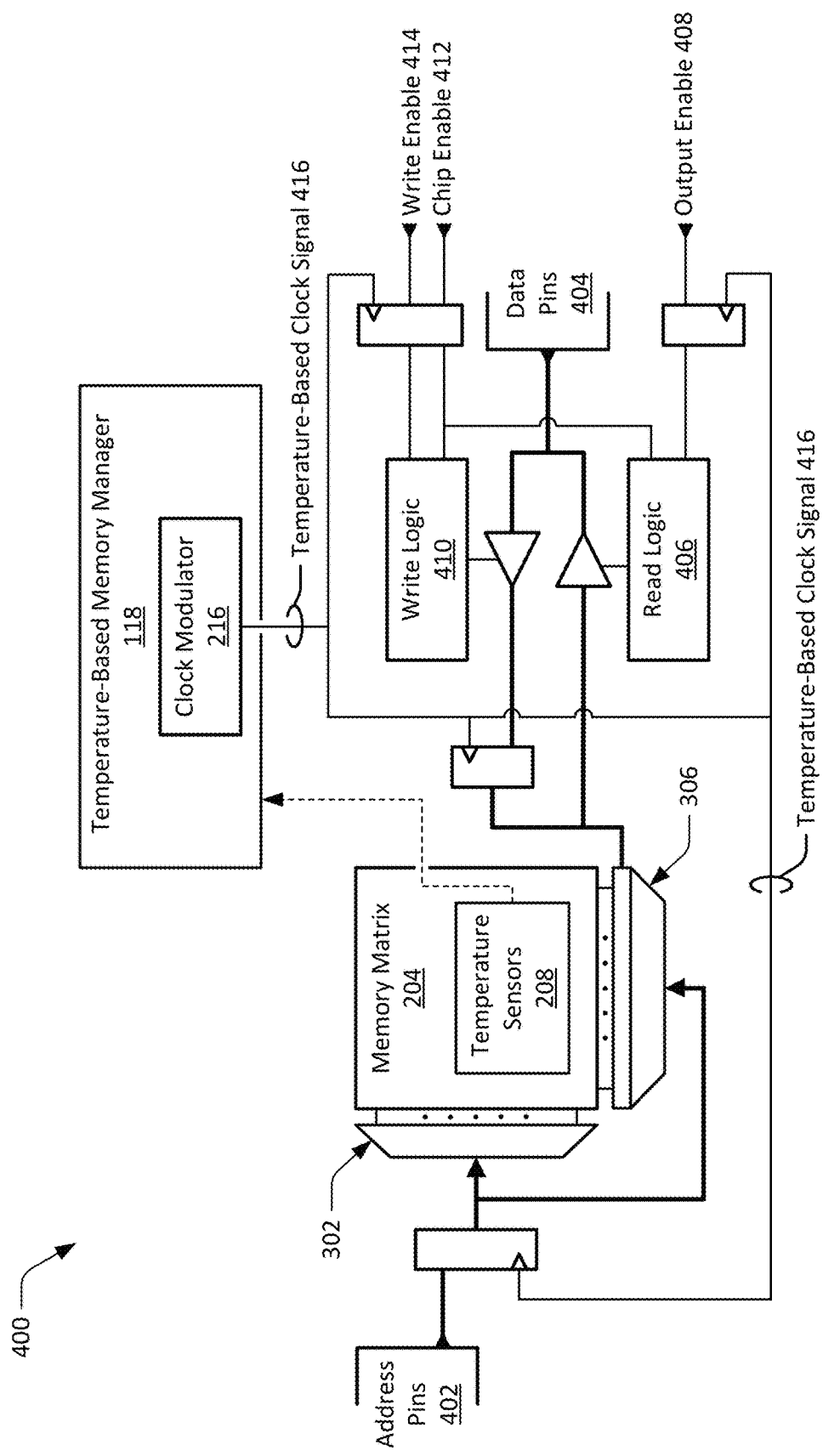
FIG. 4 illustrates an example of memory access logic implemented with temperature-based memory management.

FIG. 4 illustrates an example of memory access logic 400 implemented with temperature-based memory management in accordance with one or more aspects. Although the logic is illustrated with respect to a single memory matrix 204, the logic or aspects of temperature-based memory management can be scaled for use with any suitable number of memory matrices 204 or memory blocks 202. In this example, the access logic 400 includes address pins 402 for addressing read operations from or write operations to the memory matrix 204. The access logic 400 also includes data pins 404 coupled to the sense and drive amplifiers 308, through which data of the memory matrix is accessed. With reference to read operations, read logic 406 of the access logic 400 may be activated by the output enable line 408. In some cases, this enables a memory controller or host device to read data of the memory matrix 204 from the data pins 404. To write data to the memory matrix, write logic 410 of the access logic 400 may be activated by the appropriate chip enable line 412 and write enable line 414. By so doing, the memory controller or host device can write data to the memory matrix 204 via the data pins 404.

As shown in FIG. 4, various components of the access logic receive a temperature-based clock signal 416, which is provided by the temperature-based memory manager 118. Generally, the temperature-based memory manager 118 receives temperature readings from one or more of the temperature sensors 208 that are integrated with the storage cells of the memory matrix 204. Based on the temperature readings or temperature data, the temperature-based memory manager 118 can implement adaptive clock rate adjustments or clock/voltage tuning throughout the access logic 400. In this example, the temperature-based clock signal 416 can be used to increase or decrease a respective operational frequency of the row decode circuitry 302, the column decode circuitry 208, read logic 406, and/or the write logic 410. In some cases, the temperature-based clock signal 416 or "temperature-adaptive clock rate signal" is provided to a latch, register, flip-flop, or similar component that is configured to gate address or data information communicated with the memory matrix 204. As such, the adaptive clock signal can be applied to any suitable access logic in order to implement one or more aspects of temperature-based memory management.

Techniques for Temperature-Based Memory Management

The following discussion describes techniques for temperature-based memory management, which may reduce memory temperature, power consumption, and increase memory reliability. These techniques can be implemented using any of the environments and entities described herein, such as the temperature-based memory manager 118, temperature analysis engine 212, or adaptive decision engine 216. These techniques include methods illustrated in FIGS. 5, 6, and 7, each of which is shown as a set of operations performed by one or more entities.

These methods are not necessarily limited to the orders of operations shown. Rather, any of the operations may be repeated, skipped, substituted, or re-ordered to implement various aspects described herein. Further, these methods may be used in conjunction with one another, in whole or in part, whether performed by the same entity, separate entities, or any combination thereof. For example, the methods may be combined to implement temperature-based memory management, adaptive clock management for memory temperature control or increased memory performance, and/or improved memory reliability. In portions of the following discussion, reference will be made to the operating environment 100 of FIG. 1 and entities of FIG. 2, FIG. 3, and/or FIG. 4 by way of example. Such reference is not to be taken as limiting described aspects to the operating environment 100, entities, or configurations, but rather as illustrative of one of a variety of examples. Alternately or additionally, operations of the methods may also be implemented by or with entities described with reference to the System-on-Chip of FIG. 8 and/or FIG. 9.

Figure 5:
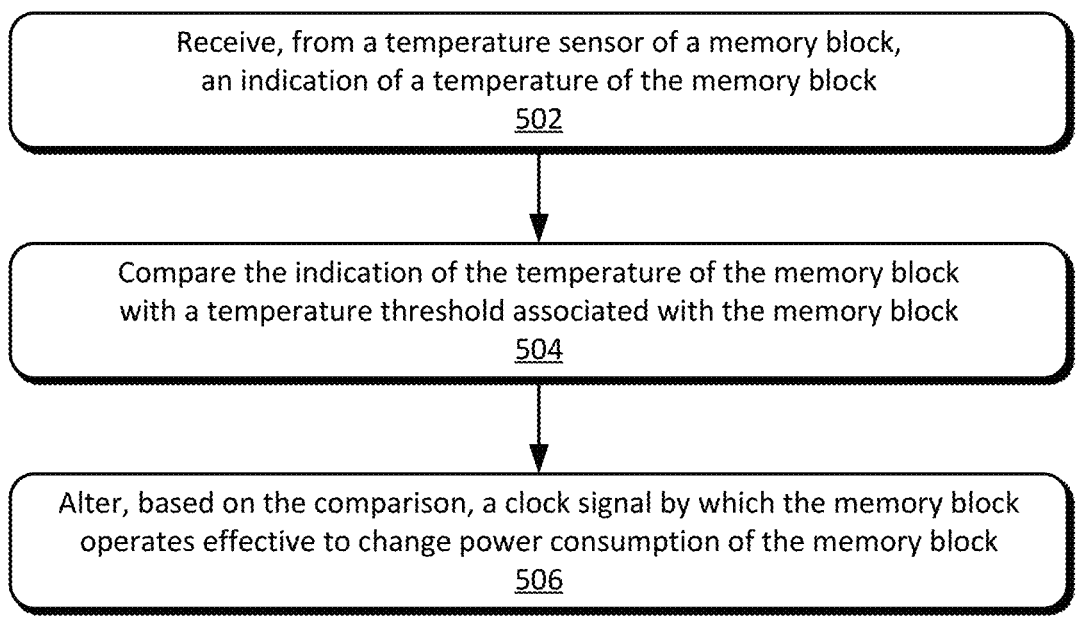
FIG. 5 depicts an example method of temperature-based memory management in accordance with one or more aspects.

FIG. 5 depicts an example method 500 for temperature-based memory management, including operations performed by the temperature-based memory manager 118, temperature analysis engine 212, or adaptive decision engine 216.

At 502, an indication of temperature of a memory block is received from a temperature sensor. The temperature sensor is integrated within the memory block or near the memory block such as to provide an indication that may represent a temperature of one or more storage cells of the memory block. In some cases, multiple temperature sensors are distributed throughout storage cells of the memory block to provide temperature information relating to a gradient of the memory block or for respective areas of storage cells. In such cases, a temperature-based memory manager may receive or collect data from the multiple temperature sensors of the memory block.

At 504, the indication of the temperature of the memory block is compared with a temperature threshold associated with the memory block. In some cases, a single temperature indication of a memory block is compared with the temperature threshold. In other cases, multiple temperature indications for a memory block are compared with the temperature threshold. The temperature threshold may be a predefined or adaptive threshold for a maximum operating temperature that is effective to prevent heat-related reliability issues. For example, the temperature threshold may be configured by a memory chip manufacturer or an original equipment manufacturer of a device in which the memory block is embodied. Alternately or additionally, a temperature analysis engine may set or adjust the temperature threshold responsive to errors or failures of the memory block or other proximate memory blocks from which temperature data is received.

At 506, a clock signal by which the memory block operates is altered effective to change power consumption of the memory block. A frequency of the clock signal may be increased or reduced based on the result of the comparison. In some cases, if the temperature of the memory block exceeds the temperature threshold, the frequency of the clock signal is reduced (or lowered) effective to reduce the temperature of the memory block. In other cases, if the temperature of the memory block does not exceed the temperature threshold, the frequency of clock signal is increased (or raised) effective to increase performance of the memory block. Alternately or additionally, the clock signal may be adjusted in predefined increments or in gradually larger increments if a previous adjustment is not sufficient to achieve the desired reduction in memory block temperature. Optionally from operation 506, the method 500 may return to operation 502 to receive an updated indication of the temperature or another indication of temperature from another temperature sensor of the memory block.

Figure 6:
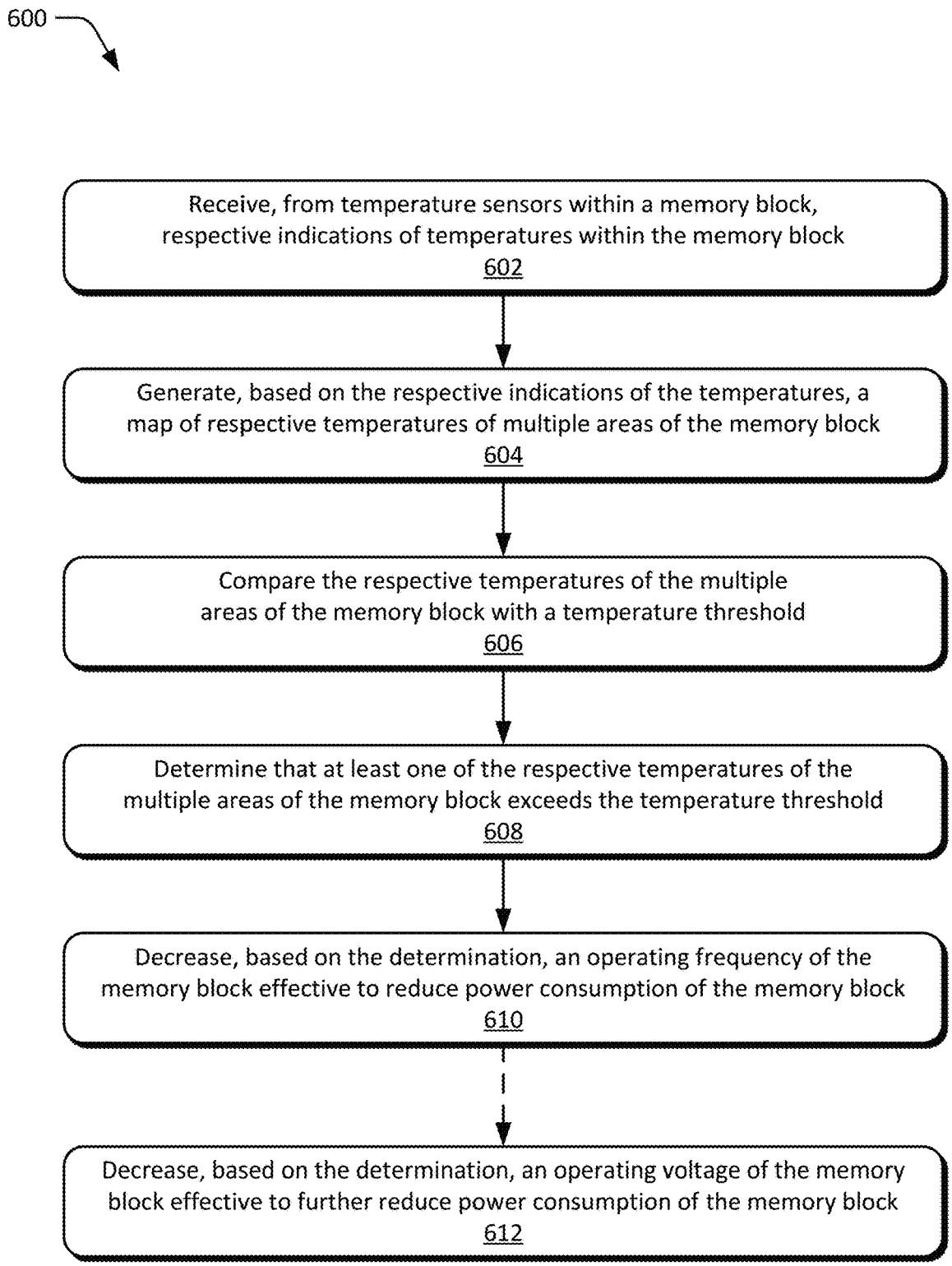
FIG. 6 depicts an example method for generating a temperature map that is useful to manage power consumption of a memory block.

FIG. 6 depicts an example method 600 for generating a temperature map that is useful to manage power consumption of a memory block, including operations performed by the temperature-based memory manager 118, temperature analysis engine 212, and/or adaptive decision engine 216.

At 602, respective indications of temperatures of a memory block are received from temperature sensors within the memory block. In some cases, each indication corresponds to a temperature within or at an edge of the memory block. Alternately or additionally, the temperatures of the memory block may correlate to specific areas of a memory matrix or a group of storage cells of the memory block. For example, the temperature sensors can be distributed throughout the memory matrix such as to provide temperature data for center locations or edge locations of the memory matrix. In one implementation, the temperature data for center locations or edge locations can be inferred without use of temperature sensors—e.g., based on a predetermined correlation of various temperatures to access requests.

At 604, a map of respective temperatures of multiple areas of the memory block is generated based on the respective indications of the temperatures. This temperature map may be useful to model a temperature gradient across or throughout the memory block. The temperature map for the memory block can be generated with any suitable modeling or analysis of the temperature indications (e.g., temperature data), such as artificial intelligence, interpolation, extrapolation, response surface analysis, statistical learning, machine learning, or the like.

At 606, the respective temperatures of the multiple areas of the memory bock are compared with a temperature threshold. The respective temperatures may include readings provided by the temperature sensors and modeled temperatures of the temperature map. In some cases, the respective temperatures may be compared with respective temperature thresholds, each of which may be defined for one of the multiple areas of the memory block. Alternately or additionally, the temperature threshold may be adjusted based on a previous error or failure of the memory block or another memory block of a memory device in which the memory block is embodied.

At 608, a determination is made that at least one of the respective temperatures of the multiple areas of the memory block exceeds the temperature threshold. In some cases, a difference between the respective temperature and the temperature threshold is also calculated, such as to provide a basis or additional data for temperature control. Alternately or additionally, a number of areas with temperatures that exceed the temperature threshold may also be determined or tracked for use as input data into a temperature control algorithm.

At 610, an operating frequency of the memory block is decreased effective to reduce power consumption of the memory block. As described herein, decreasing the power consumption of the memory block can also be effective to lower or reduce the temperature of the memory block. By so doing, operating temperatures of the memory block can be kept below temperatures that are likely to affect reliability of storage cells of the memory block. This can be effective to improve reliability and long-term performance of the memory block, particularly in high-performance or mission critical applications.

Optionally at 612, an operating voltage of the memory block is decreased effective to further reduce power consumption of the memory block. In addition to reducing the operating frequency, the operating voltage of the memory block may also be decreased for greater effect on reducing power consumption. Because operating frequency and operating voltage of the memory block are often related, the memory block can be operated at the lower voltage without any additional cost in memory performance. Reducing both of the operating voltage and operating frequency, however, may provide the temperature-based memory manager a greater degree in control of power consumption and/or temperature of the memory block.

Figure 7:
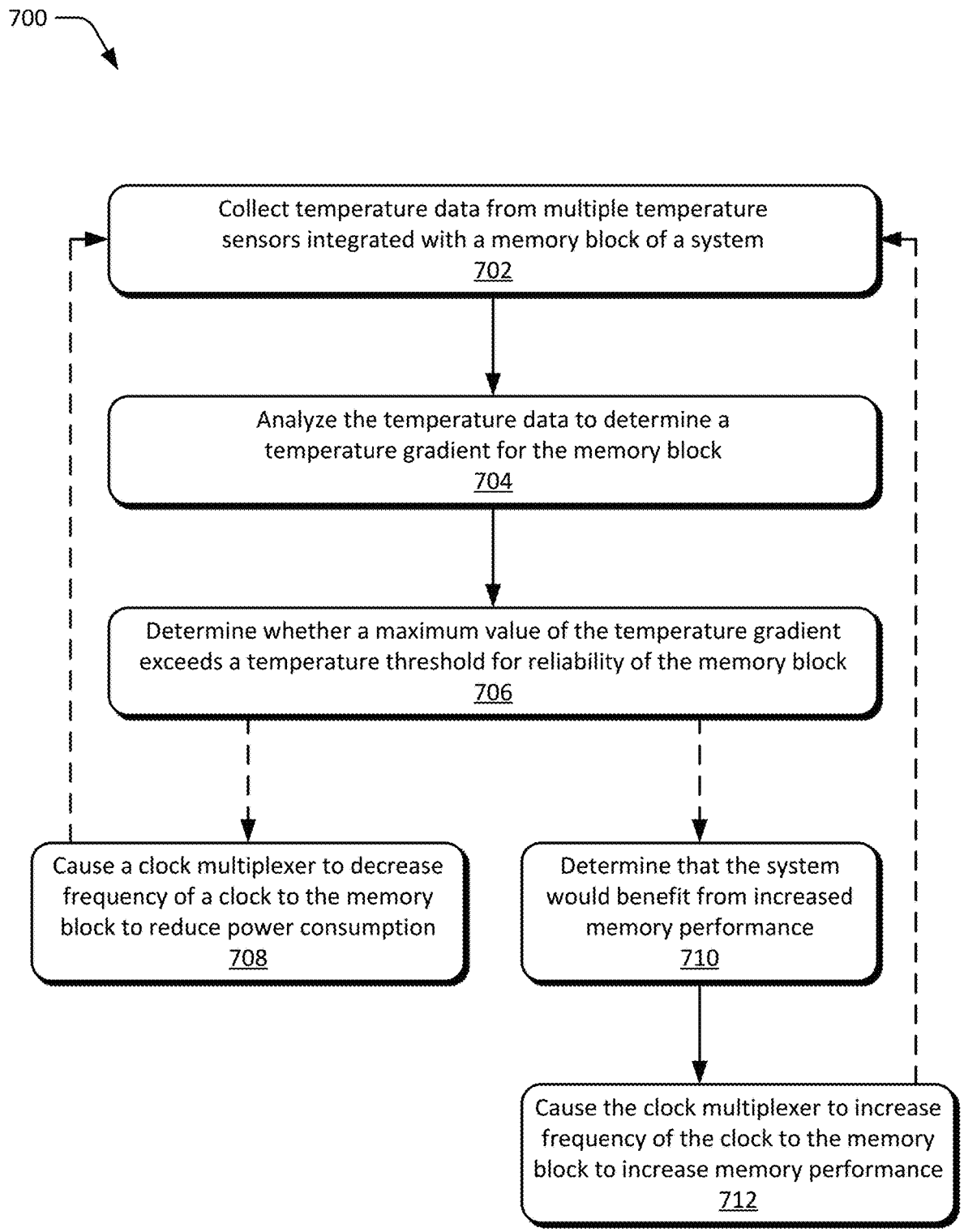
FIG. 7 depicts an example method for altering clock frequency of a memory block based on data collected from temperature sensors integrated with the memory block.

FIG. 7 depicts an example method 700 for altering clock frequency of a memory block based on data collected from temperature sensors integrated with the memory block. The operations of the method 700 may be implemented by or with components of the temperature-based memory manager 118, such as the temperature analysis engine 212, adaptive decision engine 216, and/or memory control interface 220.

At 702, temperature data is collected from multiple temperature sensors integrated with a memory block of a system. The temperature data may alternatively be inferred, e.g., based on a number of access requests, or other performance metric. In some cases, the temperature data corresponds to multiple temperatures within or at an edge of the memory block. Alternately or additionally, the temperature data for the memory block may correlate to specific areas of a memory matrix or groups of storage cells of the memory block.

At 704, the temperature data is analyzed to determine a temperature gradient for the memory block. In some cases, a maximum of the temperature gradient is also determined or modeled based on the temperature data. Alternately or additionally, a temperature map that corresponds to the temperature gradient can be generated based on the temperature data. This temperature map may be generated with any suitable modeling or analysis of the temperature data, such as artificial intelligence, interpolation, extrapolation, response surface analysis, statistical learning, machine learning, or the like At 706, it is determined whether a maximum value of the temperature gradient exceeds a temperature threshold for reliability of the memory block. In some cases, a difference between the maximum of the temperature gradient and the temperature threshold is also calculated, such as to provide an additional basis or data for temperature control algorithms. Alternately or additionally, a number of areas or values of the temperature gradient that exceed the temperature threshold may also be determined or tracked for use as input data into a temperature control algorithm.

At 708, a clock multiplexer associated with the memory block is caused to decrease frequency of a clock to the memory block. In response to at least the maximum value of the temperature gradient exceeding the temperature threshold, the clock multiplexer, or a clock generator, is caused to decrease frequency. In some cases, the amount by which to decrease the frequency is based on or correlates to a degree by which the temperature gradient exceeds the temperature threshold. By decreasing the frequency of the clock multiplexer, power consumption of the memory block can be reduced, which in turn may lower or reduce the temperature of the memory block. By so doing, operating temperatures of the memory block can be kept below temperatures that are likely to affect reliability of storage cells of the memory block. From operation 708, the method 700 may return to operation 702, such as to implement another iteration of temperature data collection, temperature analysis, and/or temperature-based management of the memory block.

Optionally at 710, a determination is made that the system would benefit from increased memory performance. In some cases, a request or indication is received from a host system or host interface that indicates an increase in memory performance (e.g., speed) would be beneficial or useful to the host system. Alternately or additionally, the temperature-based memory manager may query the host system for memory performance settings, such as in response to determining that the temperature gradient is well under the temperature threshold of the memory block.

At 712, the clock multiplexer associated with the memory block is caused to increase the frequency of the clock to the memory block. In response to the temperature gradient of the memory block not exceeding the temperature threshold, the clock multiplexer, or a clock generator, is caused to increased frequency. In some cases, the amount by which to increase the frequency is based on or correlates to a degree by which the temperature gradient does not exceed the temperature threshold. By increasing the frequency of the clock multiplexer, performance of the memory block can be increased, which in turn may improve overall system performance or responsiveness.

System-On-Chip

Figure 8:
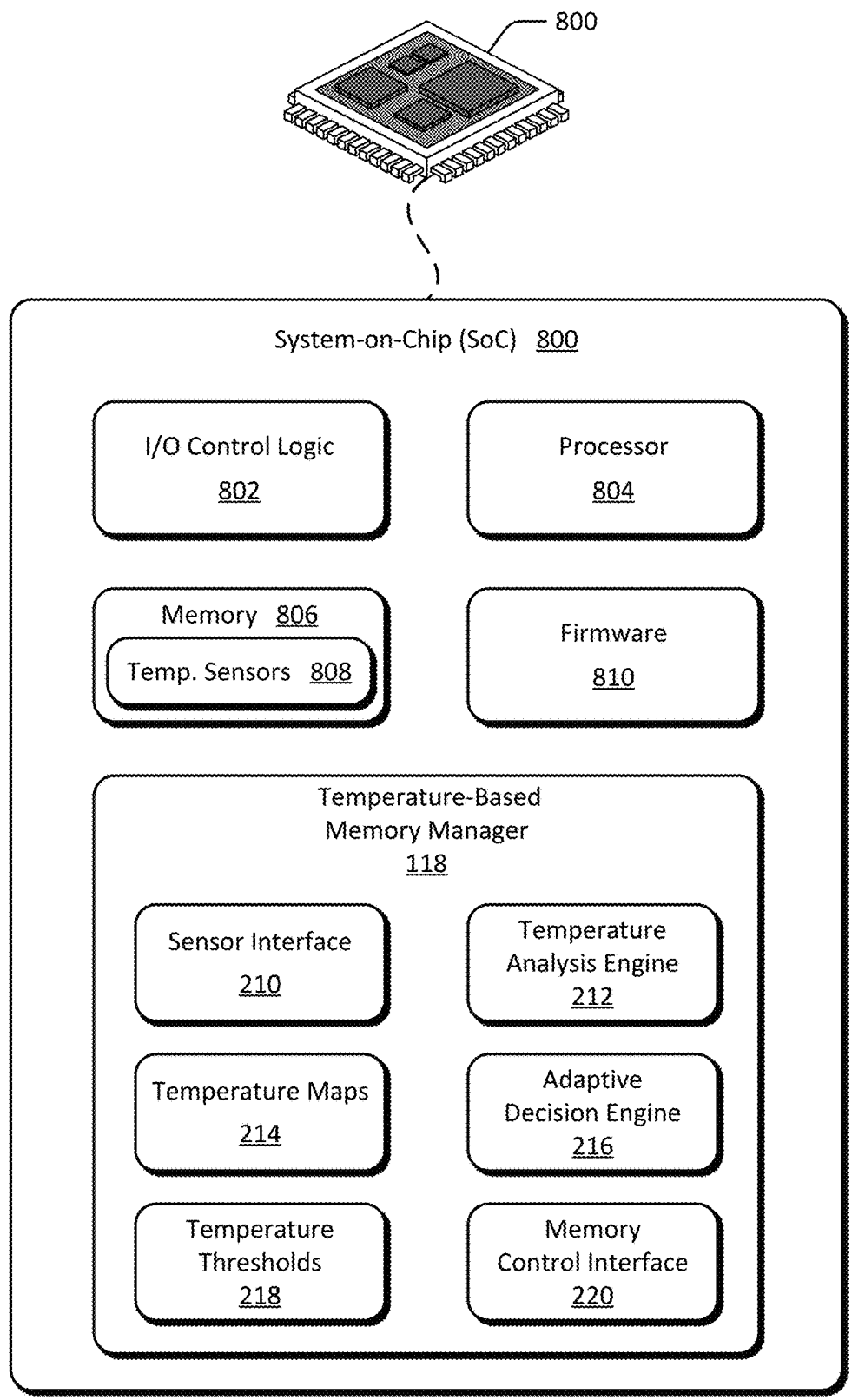
FIG. 8 illustrates an example System-on-Chip (SoC) environment for implementing aspects of temperature-based memory management.

FIG. 8 illustrates an exemplary System-on-Chip (SoC) 800 that can implement various aspects of temperature-based memory management. The SoC 800 can be implemented in any suitable device, such as a smart-phone, netbook, tablet computer, access point, network-attached storage, camera, smart appliance, printer, set-top box, server, solid state drive, memory module, automotive computing system, or any other suitable type of device (e.g., others described herein). Although described with reference to a SoC, the entities of FIG. 8 may also be implemented as other types of integrated circuits or embedded systems, such as an application-specific integrated-circuit (ASIC), memory controller, storage controller, communication controller, application-specific standard product (ASSP), digital signal processor (DSP), programmable SoC (PSoC), system-in-package (SiP), or field-programmable gate array (FPGA).

The SoC 800 can be integrated with electronic circuitry, a microprocessor, memory, input-output (I/O) control logic, communication interfaces, firmware, and/or software useful to provide functionalities of a computing device or memory device, such as any of the devices or components described herein. The SoC 800 may also include an integrated data bus or interconnect fabric (not shown) that couples the various components of the SoC for data communication between the components. The integrated data bus, interconnect fabric, or other components of the SoC 800 may be exposed or accessed through an external port, parallel memory interface, serial memory interface, serial peripheral interface (SPI) port, or any other suitable data interface. For example, components the SoC 800 may access or control external memory components and temperature sensors through an external or off-chip memory or data interface.

In this example, the SoC 800 includes various components such as input-output (I/O) control logic 802 and a processor 804, such as a microprocessor, processor core, application processor, DSP, or the like. The SoC 800 also includes memory 806 and temperature sensors 808, which are integrated with or proximate memory blocks or memory matrices of the memory 806. The memory 806 may include any type and/or combination of RAM, SRAM, DRAM, non-volatile memory, ROM, one-time programmable (OTP) memory, multiple-time programmable (MTP) memory, Flash memory, and/or other suitable electronic data storage. In some aspects, the processor 804 and code stored on the memory 806 are implemented as a memory controller or storage controller to provide various data access functionalities associated with temperature-based memory management. In the context of this disclosure, the memory 806 stores data, instructions, or other information via non-transitory signals, and does not include carrier waves or transitory signals. Alternately or additionally, SoC 800 may comprise a data interface (not shown) for accessing additional or expandable off-chip memory, such as external SRAM or Flash memory.

The SoC 800 may also include firmware 810, applications, programs, software, and/or operating system, which can be embodied as processor-executable instructions maintained on the memory 806 for execution by the processor 804 to implement functionalities of the SoC 800. The SoC 800 can also include other communication interfaces, such as a transceiver interface for controlling or communicating with components of a local on-chip (not shown) or off-chip communication transceiver. Alternately or additionally, the transceiver interface may also include or implement a signal interface to communicate radio frequency (RF), intermediate frequency (IF), or baseband frequency signals off-chip to facilitate wired or wireless communication through transceivers, physical layer transceivers (PHYs), or media access controllers (MACs) coupled to the SoC 800.

The SoC 800 also includes a temperature-based memory manager 118, which may be implemented separately as shown or combined with a memory component or memory interface. In accordance with various aspects for temperature-based memory management, the temperature-based memory manager 118 may include a sensor interface 210, temperature analysis engine 212, temperature maps 214, adaptive decision engine 216, temperature thresholds 218, and/or memory control interface 220. Any of these entities may be embodied as disparate or combined components, as described with reference to various aspects presented herein. Examples of these components and/or entities, or corresponding functionality, are described with reference to the respective components or entities of the environment 100 of FIG. 1 or respective configurations illustrated in FIG. 2, FIG. 3, and/or FIG. 4. The temperature-based memory manager 118, either in whole or part, can be implemented as processor-executable instructions maintained by the memory 806 and executed by the processor 804 to implement various aspects and/or features of temperature-based memory management.

The temperature-based memory manager 118, can be implemented independently or in combination with any suitable component or circuitry to implement aspects described herein. For example, the temperature-based memory manager 118, temperature analysis engine 212, or adaptive decision engine 216 may be implemented as part of a DSP, processor/memory bridge, I/O bridge, graphics processing unit, memory controller, storage controller, arithmetic logic unit (ALU), or the like. The temperature-based memory manager 118 may also be provided integral with other entities of SoC 800, such as integrated with the processor 804, memory 806, a memory interface, or firmware 810 of the SoC 800. Alternately or additionally, the temperature analysis engine 212, adaptive decision engine 216, memory control interface 220, and/or other components of the SoC 800 can be implemented as hardware, firmware, fixed logic circuitry, or any combination thereof.

Figure 9:
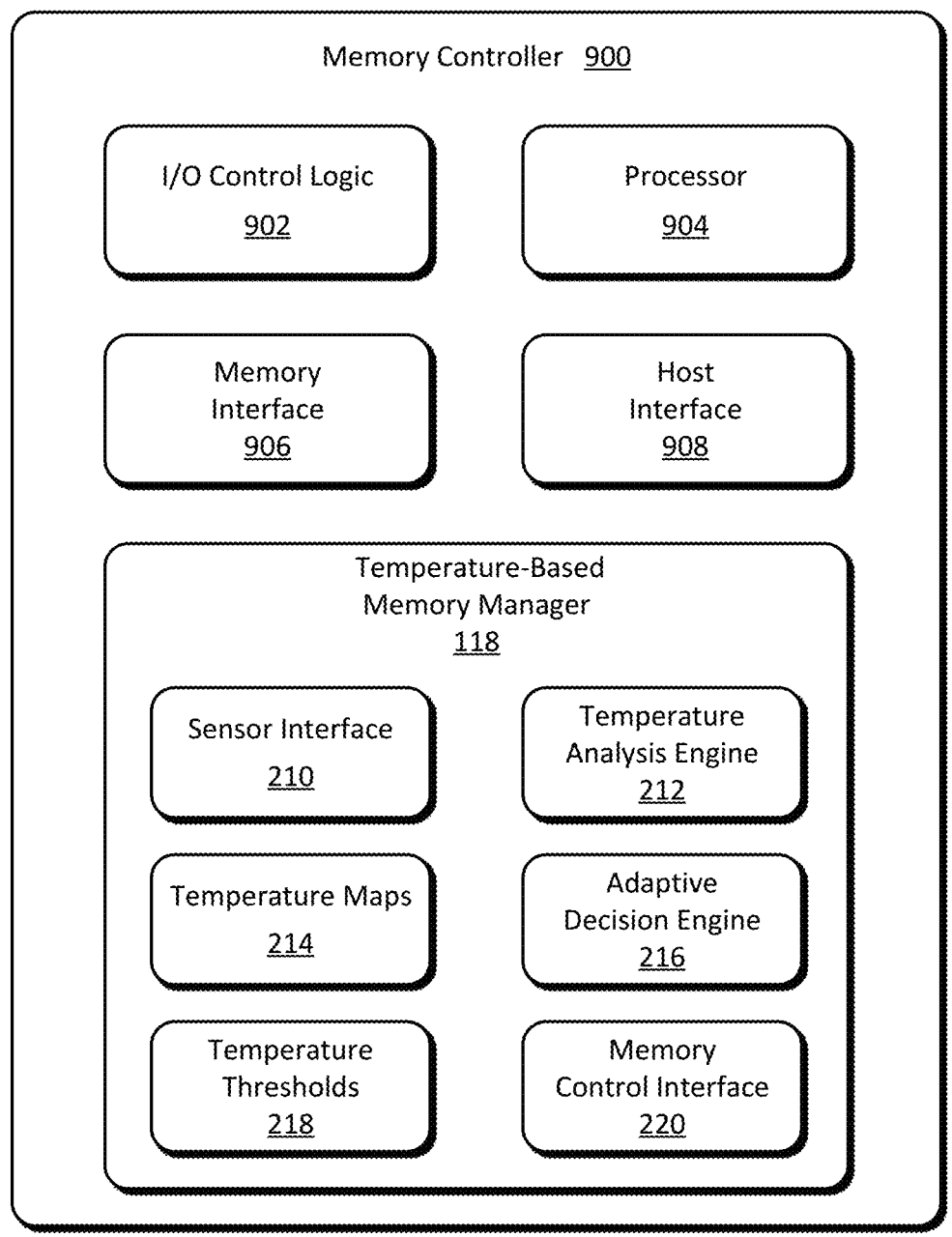
FIG. 9 illustrates an example memory controller that is configured to implement aspects of temperature-based memory management.

As another example, consider FIG. 9 which illustrates an example memory controller 900 in accordance with one or more aspects of temperature-based memory management. The memory controller 900 may be implemented similar to or with components of the SoC 800 as described with reference to FIG. 8. In other words, an instance of the SoC 800 may be configured as a memory controller, such as the memory controller 900 to manage off-chip memory blocks. In this example, the memory controller 900 includes input-output (I/O) control logic 902 and a processor 904, such as a microprocessor, processor core, application processor, DSP, or the like. The memory controller also includes a memory interface 906 and host interface 908, which enable access to memory and host system (not shown), respectively.

In some aspects, the memory controller 900 implements aspects of temperature-based memory management when controlling a memory coupled with the memory interface 906. In some cases, the memory controller 900 provides a memory interface for the host system via the host interface 908, through which memory access commands can be received from the host system. Alternately or additionally, the temperature-based memory manager 118 may receive requests or indications via the host interface 908. For example, the host system or host driver may request increased memory performance or indicate that increased memory performance would be beneficial for overall system operation.

In some aspects, the temperature-based memory manager 118 may consider the information (e.g., indications or requests) provided by the host system when analyzing memory temperature or deciding how or when to alter memory settings to manage temperature or performance of the memory. The memory interface 906 may provide a data and/or control interface suitable for accessing and controlling various types of memory, such as RAM, SRAM, DRAM, non-volatile memory, ROM, OTP memory, MTP memory, Flash memory, and/or other suitable electronic data storage. In some aspects, the processor 904 and firmware of the memory controller are implemented to provide various data access functionalities associated with temperature-based memory management.

The memory controller 900 also includes a temperature-based memory manager 118, which may be implemented separately as shown or combined with a memory component or memory interface. In accordance with various aspects, the temperature-based memory manager 118 may include a sensor interface 210, temperature analysis engine 212, temperature maps 214, adaptive decision engine 216, temperature thresholds 218, and/or memory control interface 220. Examples of these components and/or entities, or corresponding functionality, are described with reference to the respective components or entities of the environment 100 of FIG. 1 or respective configurations illustrated in FIG. 2, FIG. 3, and/or FIG. 4. The temperature-based memory manager 118, either in whole or part, can be implemented as processor-executable instructions maintained by memory of the controller and executed by the processor 904 to implement various aspects and/or features of temperature-based memory management.

Although the subject matter has been described in language specific to structural features and/or methodological operations, it is to be understood that the subject matter defined in the appended claims is not necessarily limited to the specific examples, features, or operations described herein, including orders in which they are performed.

What is claimed is:

1. A method comprising:
   receiving, from multiple temperature sensors of a memory block, respective indications of temperature at different locations of the memory block, each of the multiple temperature sensors disposed (i) between respective storage cells of the memory block and (ii) at one of the different locations, the memory block operating in accordance with a frequency of a clock signal;
   generating, based on the respective indications of temperature at the different locations of the memory block, a temperature map of respective temperatures of multiple areas of the memory block;
   comparing the respective temperatures of the multiple areas of the memory block with a temperature threshold associated with the memory block;
   determining a number of areas of the memory block having a respective temperature that exceeds the temperature threshold; and
   altering, based on the number of areas of the memory block having a respective temperature that exceeds the temperature threshold, the frequency of the clock signal by which the memory block operates to change power consumption of the memory block.

2. The method as recited in claim 1, wherein:
   at least one of the areas of the memory block is determined to have a respective temperature that exceeds the temperature threshold associated with the memory block; and
   the altering of the clock frequency comprises reducing the frequency of the clock signal by which the memory block operates to reduce the temperature of the memory block.

3. The method as recited in claim 1, wherein:
   none of the areas of the memory block are determined to have a respective temperature that exceeds the temperature threshold associated with the memory block; and
   the altering of the clock frequency comprises increasing the frequency of the clock signal by which the memory block operates to increase performance of the memory block.

4. The method as recited in claim 3, further comprising receiving, from a processing system with which the memory block is associated, an indication or request to increase performance of the memory block.

5. The method as recited in claim 1, wherein the temperature map of respective temperatures of the multiple areas of the memory block is generated through the use of one of artificial intelligence, interpolation, extrapolation, response surface analysis, or statistical learning.

6. The method as recited in claim 1, wherein altering the clock frequency comprises causing a clock generator or clock multiplexer associated with the memory block to:
   decrease a frequency of a clock signal provided to one of decoding logic, write logic, or read logic of the memory block; or
   increase the frequency of the clock signal provided to one of the decoding logic, the write logic, or the read logic of the memory block.

7. The method as recited in claim 1, further comprising altering, based on the result of the comparison, a voltage at which the memory block operates to further change power consumption of the memory block.

8. The method as recited in claim 1, wherein the temperature sensor is manufactured in a same process technology flow as the storage cells of the memory block.

9. An apparatus comprising:
   a memory configured with memory blocks of storage cells;
   multiple temperature sensors operably coupled with one of the memory blocks, the multiple temperature sensors disposed at different locations of the memory block, each of the multiple temperature sensors disposed between at least two of the storage cells of the memory block;
   a clock circuit configured to provide a clock signal to the memory block to enable, via the clock signal, access of the memory block, wherein the clock signal has a frequency;
   a hardware-based processor; and
   non-transitory computer-readable storage media comprising processor-executable instructions that, responsive to execution by the hardware-based processor, implement a temperature-based memory manager to:
      receive, from the multiple temperature sensors of the memory block, respective indications of temperature at the different locations of the memory block;
      generate, based on the respective indications of temperature at the different locations of the memory block, a temperature map of respective temperatures of multiple areas of the memory block;
      compare the respective temperatures of the multiple areas of the memory block with a temperature threshold associated with the memory block;
      determine a number of areas of the memory block having a respective temperature that exceeds the temperature threshold; and
      alter, based on the number of areas of the memory block having a respective temperature that exceeds the temperature threshold, the frequency of the clock signal provided by the clock circuit to change power consumption of the memory block.

10. The apparatus as recited in claim 9, wherein the temperature-based memory manager is further implemented to:
   determine that at least one of the areas of the memory block has a respective temperature that exceeds the temperature threshold associated with the memory block; and
   alter the frequency of the clock signal by decreasing the frequency of the clock signal to reduce the temperature of the memory block.

11. The apparatus as recited in claim 9, wherein the temperature-based memory manager is further implemented to:
   determine that none of the areas of the memory block have a respective temperature that exceeds the temperature threshold associated with the memory block; and alter the frequency of the clock signal by increasing the frequency of the clock signal to increase performance of the memory block.

12. The apparatus as recited in claim 9, wherein the temperature-based memory manager is further implemented to alter, based on the result of the comparison, a voltage at which the memory block operates to further change power consumption of the memory block.

13. The apparatus as recited in claim 9, wherein the temperature sensor is manufactured in a same process technology flow as the storage cells of the memory block.

14. The apparatus as recited in claim 9, wherein:
the temperature map of respective temperatures of the multiple areas of the memory block comprises a temperature gradient across the memory block; or
the temperature-based memory manager is further implemented to generate the temperature map of respective temperatures of the multiple areas of the memory block through the use of one of artificial intelligence, interpolation, extrapolation, response surface analysis, or statistical learning.

15. A System-on-Chip (SoC) comprising:
an interface to a memory block of storage cells;
an interface to multiple temperature sensors operably coupled with the memory block of storage cells, the multiple temperature sensors disposed at different locations of the memory block, each of the multiple temperature sensors disposed between respective pairs of the memory storage cells;
a hardware-based processor;
a memory storing processor-executable instructions that, responsive to execution by the hardware-based processor, implement a temperature-based memory manager to:
receive, from the multiple temperature sensors, respective indications of temperature at the different locations of the memory block;
generate, based on the respective indications of temperature at the different locations of the memory block, a temperature map of respective temperatures of multiple areas of the memory block;
compare the respective temperatures of the multiple areas of the memory block with a temperature threshold associated with the memory block;
determine a number of areas of the memory block having a respective temperature that exceeds the temperature threshold; and
alter, based on the number of areas of the memory block having a respective temperature that exceeds the temperature threshold, a frequency of a clock signal by which the storage cells of the block of memory operate to change power consumption of the memory block.

16. The SoC as recited in claim 15, wherein the temperature-based memory manager is further implemented to:
determine that at least one of the areas of the memory block has a respective temperature that exceeds the temperature threshold associated with the memory block; and
alter the frequency of the clock signal by decreasing the frequency of the clock signal to reduce the temperature of the storage cells of the memory block.

17. The SoC as recited in claim 15, wherein the temperature-based memory manager is further implemented to:
determine that none of the areas of the memory block have a respective temperature that exceeds the temperature threshold associated with the memory block; and
alter the frequency of the clock signal by increasing the frequency of the clock signal to increase read performance or write performance of the storage cells of the memory block.

18. The SoC as recited in claim 15, wherein the temperature-based memory manager is further implemented to alter, based on the result of the comparison, a voltage at which the memory block operates to further change power consumption of the memory block.

19. The SoC as recited in claim 15, wherein the temperature sensors are manufactured in a same process technology flow as the storage cells of the memory block.

20. The SoC as recited in claim 15, wherein:
the temperature map of respective temperatures of the multiple areas of the memory block comprises a temperature gradient across the memory block; or
the temperature-based memory manager is further implemented to generate the temperature map of respective temperatures of the multiple areas of the memory block through the use of one of artificial intelligence, interpolation, extrapolation, response surface analysis, or statistical learning.

* * * * *